(12) United States Patent
Chen et al.

(10) Patent No.: US 7,656,704 B2
(45) Date of Patent: Feb. 2, 2010

(54) MULTI-LEVEL OPERATION IN NITRIDE STORAGE MEMORY CELL

(75) Inventors: Po-An Chen, Hsinchu (TW); Yu-Kuo Yang, Hsinchu (TW); Tzu-Ching Chuang, Hsinchu (TW); Hsiu-Han Liao, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 244 days.

(21) Appl. No.: 11/489,475

(22) Filed: Jul. 20, 2006

(65) Prior Publication Data

US 2008/0019181 A1 Jan. 24, 2008

(51) Int. Cl.
*G11C 11/34* (2006.01)

(52) U.S. Cl. .......................... 365/185.03; 365/185.28; 365/189.02; 365/189.16

(58) Field of Classification Search ............ 365/185.03, 365/185.23, 189.09, 189.16, 185.18, 185.28, 365/189.02
See application file for complete search history.

(56) References Cited

U.S. PATENT DOCUMENTS

| | | | | |
|---|---|---|---|---|
| 6,011,725 | A | 1/2000 | Eitan | |
| 6,278,633 | B1 * | 8/2001 | Wong et al. ............ | 365/185.03 |
| 6,320,786 | B1 | 11/2001 | Chang et al. | |
| 6,487,114 | B2 | 11/2002 | Jong et al. | |
| 6,522,584 | B1 * | 2/2003 | Chen et al. ............. | 365/185.18 |
| 6,816,414 | B1 * | 11/2004 | Prinz ...................... | 365/185.29 |
| 6,937,511 | B2 * | 8/2005 | Hsu et al. ............... | 365/185.03 |
| 6,970,385 | B2 * | 11/2005 | Sakakibara ............ | 365/185.29 |
| 7,006,378 | B1 * | 2/2006 | Saito et al. ............. | 365/185.05 |
| 7,515,465 | B1 * | 4/2009 | Wang ..................... | 365/185.03 |
| 2006/0092684 | A1 * | 5/2006 | Eshel ....................... | 365/104 |

FOREIGN PATENT DOCUMENTS

| | | |
|---|---|---|
| JP | 07-029382 | 1/1995 |
| JP | 10-513295 | 12/1998 |
| JP | 2001-102466 | 4/2001 |
| JP | 2002-170891 | 6/2002 |

OTHER PUBLICATIONS

Hayashi et al., "Twin MONOS cell with dual control gates," Published 2000. 2000 Symposium on VLSI Technology Digest of Technical Papers. pp. 122-123.*
Tzu-Hsuan Hsu et al., "Investigation of Maximum Current Sensing Window for Two-Side Operation, Four-Bit/Cell MLC Nitride-Trapping Nonvolatile Flash Memories", IEEE Electron Device Letters, vol. 25, No. 12, pp. 795-797, Dec. 2004.

* cited by examiner

*Primary Examiner*—Tuan T Nguyen
*Assistant Examiner*—Alexander Sofocleous
(74) *Attorney, Agent, or Firm*—Finnegan, Henderson, Farabow, Garrett, Dunner, LLP

(57) ABSTRACT

A method for programming a multi-level nitride storage memory cell capable of storing different programming states corresponding to multiple different threshold voltage levels includes providing a variable resistance capable of providing a plurality of different resistance values; connecting a drain side of the nitride storage memory cell to a selected one of the plurality of resistance values that corresponds to one of the multiple threshold voltage levels; and programming the nitride storage memory cell to store one of the program states corresponding to the one of the threshold voltage levels by applying a programming voltage to the drain side through the selected resistance.

6 Claims, 7 Drawing Sheets

200

MULTI-LEVEL OPERATION IN NITRIDE STORAGE MEMORY CELL

TECHNICAL FIELD

The present invention relates generally to methods and systems for multi-level operation in nitride storage memory cells.

BACKGROUND

A flash memory device is a non-volatile semiconductor memory device, which retains its memory contents even if it is powered off. It offers fast read access time and better shock resistance compared to hard disks. As a result, flash memory devices are popular for applications such as storage on battery-powered devices. Today, flash memory devices are extensively used in consumer electronic products.

A flash memory device stores information in memory cells, each of which traditionally stores one bit of information. More recently, flash memory devices have been developed to store more than 1 bit per cell and are sometimes referred to as multi-level cell devices. This ability to store multiple bits per cell reduces cost and allows the production of higher density flash memory.

In general, there are two ways to gain higher density for flash memory cells. One way is to achieve multi-level operation and control mainly by circuit design consideration such as in stacked gate flash memory. Another way is to enable storage of multiple states in a cell by using nitride storage material, resulting in devices such as Nitride Read Only Memory (NROM), Silicon Oxide Nitride Oxide Silicon (SONOS), and Twin Metal Oxide Nitride Oxide Semiconductor (TwinMONOS).

FIG. 1 illustrates a cross-sectional view of a conventional nitride read only memory (NROM) cell. The NROM cell includes a p-type substrate 150 having formed therein an $n^+$-type source region 160 and an $n^+$-type drain region 170, and a control gate 180. A silicon nitride layer 182 is sandwiched between two oxide layers 184 and 186. A channel 188 is formed under the oxide layer 184 and between the source region 160 and the drain region 170. The NROM cell can be programmed to store two physically separated bits 192 and 194.

Programming of the NROM can be performed by Channel Hot Electron (CHE) injection, which generates hot electrons in the channel 188. Some of these hot electrons gain enough energy to travel through the oxide layer 184 and become trapped in the silicon nitride layer 182. By interchanging the role of the source and drain terminals, the trapped charge will move to the region in the silicon nitride layer 182 near the source region 160 or near the drain region 170. The localized trapped charge near the source region 160 represents bit 192, while the localized trapped charge near the drain region 170 represents bit 194. Therefore, a nitride storage memory cell such as a NROM cell can have a density of 2 bits/cell.

Further, more recently, there have been developed structures and techniques for multi-level storage at each storage location in the nitride layer of storage devices containing an oxide-nitride-oxide (ONO) structure, such as any of the above listed NROM, SONOS and TwinMONOS devices. As a result, for example, each bit 192 or 194 of the NROM shown in FIG. 1 could be programmed to represent one of multiple program states.

In order to read data stored in the conventional 1 bit/cell flash memory device, the presence or absence of current is sensed and translated into 1's and 0's, representing the stored data. In order to read data stored in a multi-level cell device, an amount of current flow or a distinct threshold voltage range may be sensed, rather than simply detecting the presence or absence of current. Each distinct threshold voltage range represents a distinct program state. For example, in a 2 bits/cell memory cell, a first threshold voltage range covering voltages less than 3.0 V may represent a program state 00 (or program level 0), a second threshold voltage range covering voltages from 3.25 V to 3.75 V may represent a program state 01 (or program level 1), a third threshold voltage range covering voltages from 4.25 V to 4.75 V may represent a program state 10 (or program level 2), and a fourth threshold voltage range covering voltages greater than 5.0 V may represent a program state 11 (or program level 3).

SUMMARY

Consistent with the present invention, methods are disclosed herein for programming a multi-level nitride storage memory cell capable of storing different programming states corresponding to multiple different threshold voltage levels. The methods include providing a variable resistance capable of providing a plurality of different resistance values; connecting a drain side of the nitride storage memory cell to a selected one of the plurality of resistance values that corresponds to one of the multiple threshold voltage levels; and programming the nitride storage memory cell to store one of the program states corresponding to the one of the threshold voltage levels by applying a programming voltage to the drain side through the selected resistance.

Also consistent with the present invention, multi-level flash memory devices disclosed herein include a nitride storage memory cell and a variable resistance capable of providing a plurality of different resistance values, wherein a drain side of the nitride storage memory cell is connectable to a selected one of the plurality of resistance values that corresponds to one of the multiple threshold voltage levels. The variable resistance is adapted for coupling a programming voltage to the drain side.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments.

DETAILED DESCRIPTION

Reference will now be made in detail to exemplary embodiments consistent with the present invention, examples of which are illustrated in the accompanying drawings. Wherever possible, the same reference numbers will be used throughout the drawings to refer to the same or like parts. While the description includes exemplary embodiments, other embodiments are possible, and changes may be made to the embodiments described without departing from the spirit and scope of the invention. The following detailed description does not limit the invention. Instead, the scope of the invention is defined by the appended claims and their equivalents.

Figure 1:
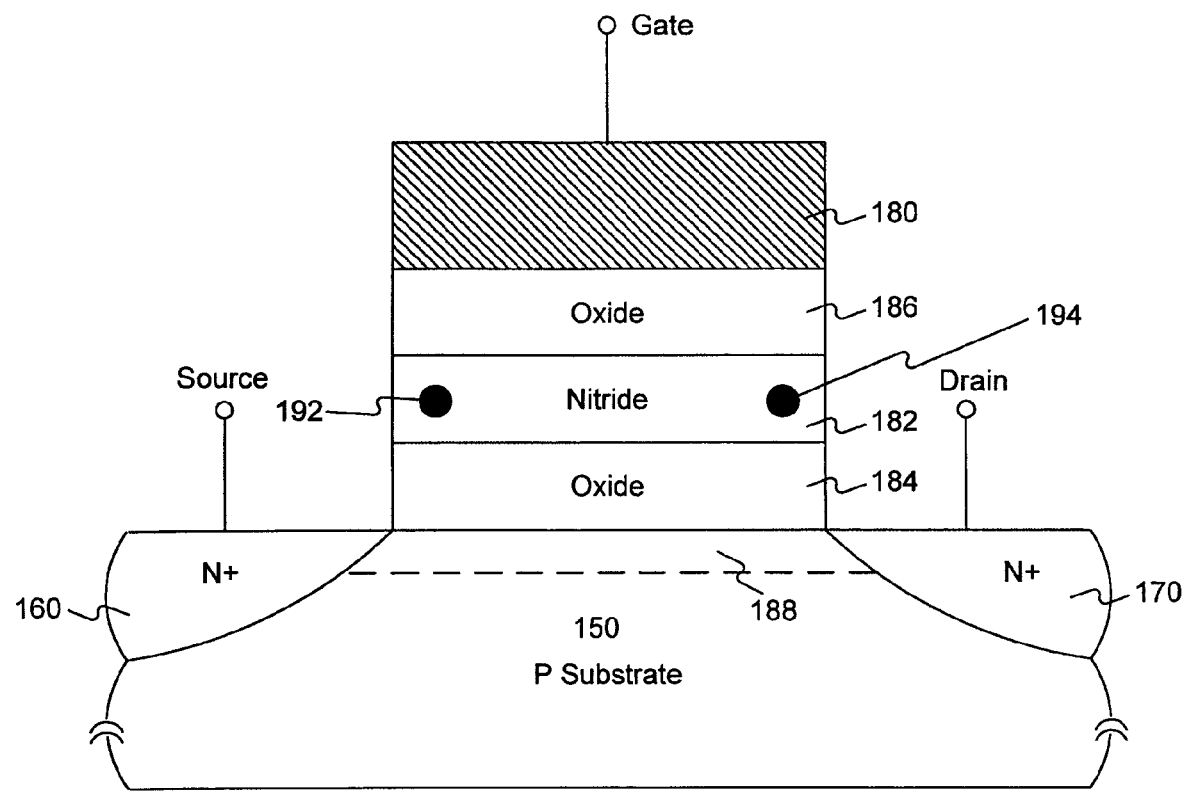
FIG. 1 is a cross-sectional view illustrating a conventional NROM cell.
Figure 2:
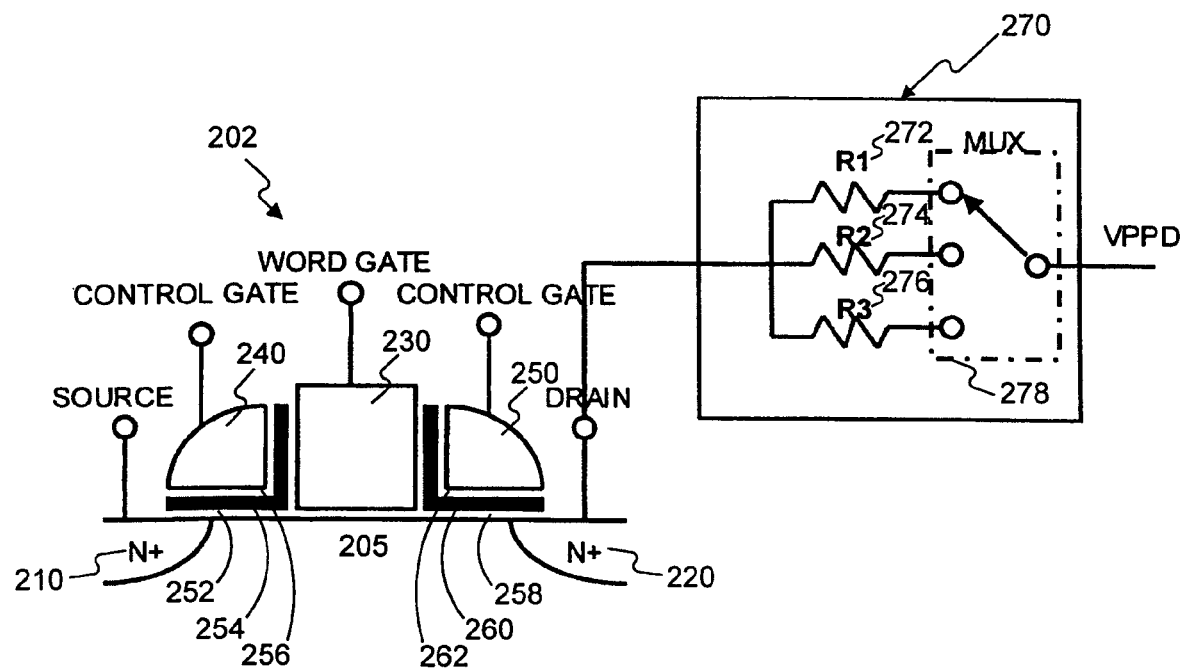
FIG. 2 is schematic diagram illustrating an exemplary structure for multi-level operation of a TwinMONOS memory cell.

FIG. 2 is a schematic diagram illustrating an exemplary structure 200 for multi-level operation of a TwinMONOS memory cell 202 according to one embodiment of the present invention. The TwinMONOS memory cell 202 includes a p-type substrate 205 having formed therein an $n^+$-type source region 210 and an $n^+$-type drain region 220, a word gate 230, and two control gates 240 and 250 that respectively partially overlie the source region 210 and the drain region 220. Thus, the control gate 240 is located between the source region 210 and the word gate 230, while the control gate 250 is between the drain region 220 and the word gate 230.

The TwinMONOS memory cell 202 further includes between the control gate 240 and the substrate 205, an oxide layer 252, a nitride layer 254 and an oxide layer 256. The layers 252, 254, and 256 also extend between the control gate 240 and the word gate 230. Additionally, the cell 202 includes an oxide layer 258, a nitride layer 260, and an oxide layer 262 between the control gate 250 and the substrate 205. The layers 258, 260, and 262 also extend between the control gate 250 and the word gate 230. Each of the oxide layers 252, 256, 258, and 262 can be $SiO_2$ and each nitride layer can be $Si_3N_4$. Each of the control gates 240 and 250 can be doped polysilicon or amorphous silicon.

As noted above, the acronym "MONOS" stands for metal-oxide-nitride-oxide-semiconductor. Thus, TwinMONOS cell 202 includes two MONOS structures respectively including control gate 240 or 250 as its "metal" component, the oxide-nitride-oxide (ONO) layers therebelow, and the semiconductor 205 substrate beneath the ONO layers.

Each MONOS structure is capable of storing charge in traps in the nitride layer. The stored charge represents stored data. In the present embodiment, the cell 202 is capable of multi-level data storage in each of the two MONOS structures respectively including the control gates 240 and 250. That is, several different amounts of charge can be stored in each of the two MONOS structures, where each charge amount corresponds to a different threshold voltage and corresponding program state. In the present embodiment, it is assumed that levels corresponding to four different program states can be programmed into each of the two MONOS structures. As a result, two bits can be programmed into each of the two MONOS structures.

Embodiments consistent with the present invention are directed to structure and method for programming and reading data from memory cells such as the TwinMONOS memory cell 202, as well as other memory cell structures utilizing a nitride storage layer and capable of storing multiple bits of data by multi-level operation.

In order to program and read multiple program states in a memory cell such as the memory cell 202, or another cell capable of multi-level storage, structure 200 further includes a variable resistance 270 coupled to the drain side of the TwinMONOS memory cell 202. The variable resistance 270 is capable of coupling one of a plurality of different resistance values to the drain side of the cell 202. A programming voltage VPPD shown in FIG. 2 or a read voltage, not shown, may be applied to the drain side through the variable resistance 270.

In one embodiment, the variable resistance 270 comprises a resistor circuit. The resistor circuit includes a plurality of resistors 272, 274, and 276, and a multiplexer 278. Resistors 272, 274, and 276 may have different resistance values and are connected in parallel. The multiplexer 278 has an input for receiving the programming voltage VPPD or the read voltage and a plurality of outputs respectively coupled to first ends of the plurality of resistors 272, 274, and 276. As a result, the multiplexer 278 is controllable to couple a selected one of the plurality of resistors to the drain side of the memory cell 202 and apply the programming or read voltage to the selected resistor.

In addition to resistors 272, 274, and 276, the variable resistance 270 may also be capable of directly coupling the applied programming or read voltage to the drain side, i.e., with a zero magnitude resistance.

Referring back to FIG. 2, each of resistors 272, 274, and 276 has a resistance value selected to correspond to one of the multiple threshold voltage levels (multiple threshold voltage ranges) corresponding to the different program states of the memory cell 202. In one embodiment, a program state 01 may be achieved by connecting resistor 272 to the drain side of the TwinMONOS memory cell 202. Similarly, a program state 10 may be achieved by connecting resistor 274, while a program state 11 may be achieved by connecting resistor 276. The state 00 may represent an erase state. Accordingly, two bits can be programmed into each of the two MONOS structures of the memory cell 202, while either one of the two MONOS structures is connected to one of the resistances of variable resistance 270 and used as the drain side of the TwinMONOS memory cell 202.

Programming either of the two MONOS structures of the memory cell 202 requires applying appropriate voltage to the word gate 230, respective control gates 240 and 250, source 210, and drain 220. As explained above, the programming operation includes applying the programming voltage to the drain 220 through the resistance value of variable resistance 270 corresponding to the desired program state. Exemplary voltages for programming the ONO structure beneath the control gate 250 include 0 V applied to the source 210; 4.7 V applied to the control gate 240; 1.8 V applied to the word gate 230; 5.5 V applied to the control gate 250; and 4.7 V applied to the drain 220.

Reading either of the two MONOS structures of the memory cell 202 also requires applying appropriate voltages to the cell 202. The read operation includes applying the read voltage to the drain 220 through one of the resistances of the variable resistance 270. The read operation may be achieved by operating in a reverse read mode. Reverse read mode refers to applying the programming voltage to one side (either drain side or source side) of the cell 202 but reading the cell 202 by applying a read voltage to the other side of the cell 202. In one embodiment, the variable resistance 270 is connected to the side of the cell 202 to which a read voltage is applied. Exemplary voltages for reading the program state stored in the ONO structure beneath the control gate 250 include 1.5 V applied to the source 210; 4.3 V applied to the control gate 240; 1.8 V applied to the word gate 230; 1.3 V applied to the control gate 250; and 0 V applied to the drain 220.

Erasing the data stored in at least one of the two MONOS structures of the memory cell 202 requires applying appropriate voltages to the cell 202. The erase operation includes applying the erase voltage through one of the resistances of the variable resistance 270. Exemplary voltages for erasing the program state stored in the ONO structure beneath both the control gates 240 and 250 include 5 V applied to the source 210; −3 V applied to the control gate 240; −2 V applied to the word gate 230; −3 V applied to the control gate 250; and 5 V applied to the drain 220.

Although FIG. 2 shows the variable resistance 270 having three resistance values, one of ordinary skill in the art will recognize that, consistent with embodiments of the present invention, variable resistances of other types are contemplated. For example, a variable resistance having more than three resistance values may enable achievement of greater storage density.

Some advantages of connecting a variable resistance to the drain side of the nitride storage memory cell, such as memory cell 202, as opposed to the source side, are set forth in FIGS. 3A, 3B, 4A, and 4B. FIGS. 3A, 3B, 4A, and 4B illustrate graphical plots of actual test data.

Figure 3A:
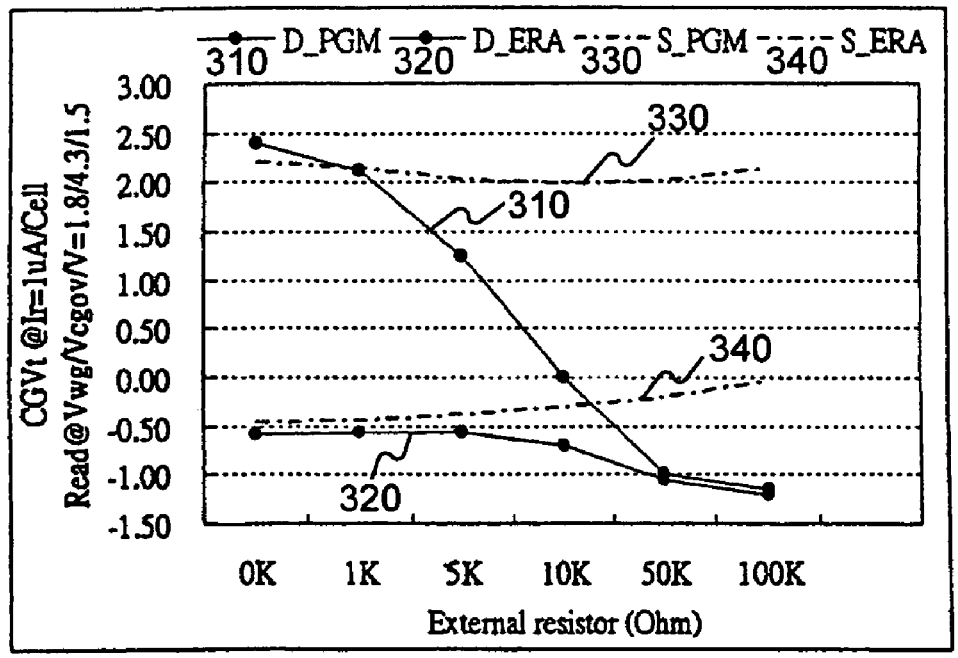
FIG. 3A illustrates a graphical representation of a difference between the source side resistance effect and the drain side resistance effect on threshold voltages of the TwinMONOS memory cell for program and erase.

FIG. 3A illustrates a graphical representation of a difference between the source side resistance effect and the drain side resistance effect on threshold voltages of the memory cell 202 for program and erase operations. Curves 310 and 320 represent the threshold voltages for program and erase, respectively, while different resistances were connected to the drain side of the TwinMONOS memory cell 202. Curves 330 and 340, on the other hand, represent the threshold voltages for program and erase, respectively, while different resistances were connected to the source side of the TwinMONOS memory cell 202. In FIG. 3A, the ordinate represents the value of threshold voltage when 1.8 V ($V_{wg}$), 4.3 V ($V_{cgov}$), and 1.5 V (V) were applied to the word gate 230, control gate 240, and the drain side, respectively, of the TwinMONOS memory cell 202.

When the variable resistance 270 was connected to the drain side of the TwinMONOS memory cell 202, as the resistance value of the variable resistance increased, it was observed that the programming speed decreased. In addition, the program threshold voltage 310 decreased when the resistance value increased. The erase threshold voltage 320 also decreased at larger resistance values, such as 50K ohms. Generally, erase threshold voltage 320 should be the same regardless of the value of the resistance connected to the TwinMONOS memory cell 202. However, it was observed that the erase threshold voltage 320 decreased due to the different initial states of the drain side and the source side of the TwinMONOS memory cell 202.

In contrast, when different resistances were connected to the source side of the TwinMONOS memory cell 202, as the resistance value increased, it was observed that program speed remained substantially unchanged. In addition, the program threshold voltage 330 did not change significantly as the resistance value increased. Moreover, the erase threshold voltage 340 increased only a small amount, i.e., by about 0.3 V, with the increase of the resistance value, due to body effect. Because the program threshold voltage 330 stayed essentially the same at different resistance values, it did not provide a sufficient window for the memory cell to perform multi-level operation.

Figure 3B:
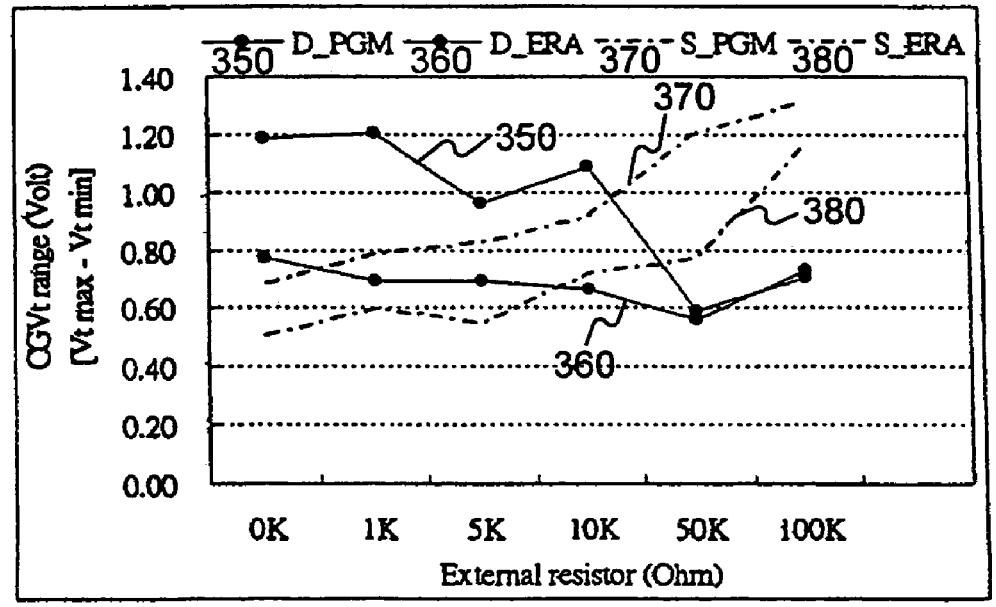
FIG. 3B illustrates a graphical representation of a difference between the source side resistance effect and the drain side resistance effect on threshold voltage ranges of the TwinMONOS memory cell for program and erase.

FIG. 3B illustrates a graphical representation of a difference between the source side resistance effect and the drain side resistance effect on threshold voltage ranges of the memory cell 202 for program and erase. Curves 350 and 360 represent threshold voltage ranges for program and erase, respectively, in response to different resistances being connected to the drain side of the TwinMONOS memory cell 202. Curves 370 and 380, on the other hand, represent threshold voltage ranges for program and erase, respectively, in response to different resistances being connected to the source side of the TwinMONOS memory cell 202. In FIG. 3B, the ordinate represents the value (width) of threshold voltage ranges, calculated as the difference between a maximum threshold voltage and a minimum threshold voltage.

As shown in FIG. 3B, when different resistances were connected to the drain side of the TwinMONOS memory cell 202 during programming and erasing, as the resistance value increased, program threshold voltage range 350 generally decreased. Erase threshold voltage range 360, however, did not change significantly for the different resistance values.

In contrast, when different resistances were connected to the source side of the TwinMONOS memory cell 202 during programming and erasing, as the resistance value increased, program threshold voltage range 370 increased. Erase threshold voltage range 380 also increased with the increase of the resistance value. Because each threshold voltage range represents a program state, it may be difficult to discern various program states for multi-level operation when program and erase threshold voltage ranges increase as the resistance value increases.

Figure 4A:
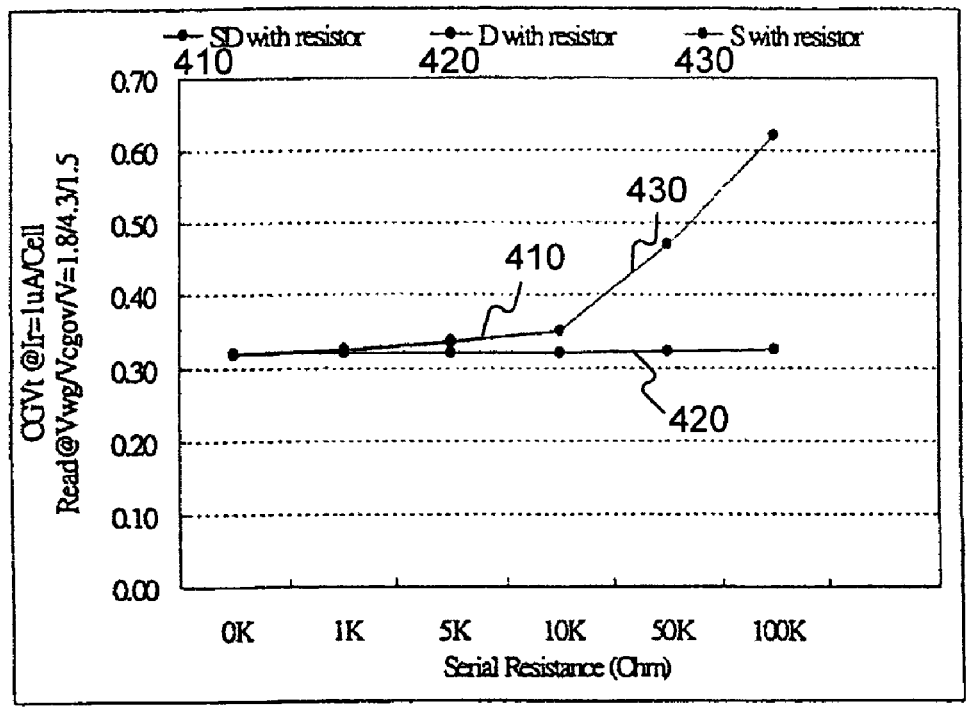
FIG. 4A illustrates a graphical representation of a difference between the source side resistance effect and the drain side resistance effect on threshold voltages of the TwinMONOS memory cell for read.
Figure 4B:
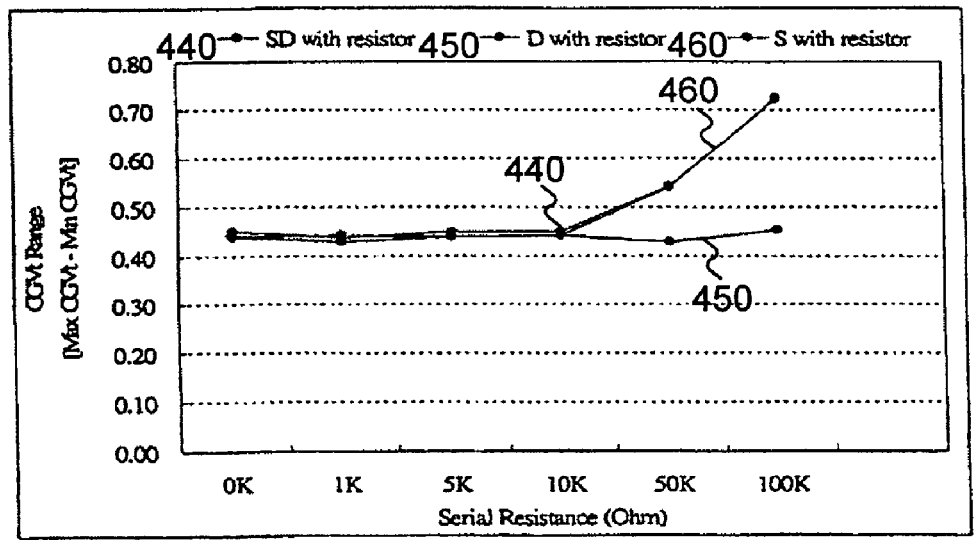
FIG. 4B illustrates a graphical representation of a difference between the source side resistance effect and the drain side resistance effect on threshold voltage ranges of the TwinMONOS memory cell for read.

Advantages of connecting a variable resistance to the drain side, as opposed to the source side, of the memory cell 202 can be further illustrated during a read operation, as shown in FIGS. 4A and 4B.

FIG. 4A illustrates a graphical representation of a difference between the source side resistance effect and the drain side resistance effect on threshold voltages of the memory cell 202 for a read operation. Curve 410 represents the threshold voltages during read while different resistances were connected to both the source and drain sides of the TwinMONOS memory cell 202. Curve 420 represents the threshold voltages during read while different resistances were connected to the drain side of the TwinMONOS memory cell 202. Curve 430 represents the threshold voltages during a read operation while different resistances were connected to the source side of the TwinMONOS memory cell 202. In FIG. 4A, the ordinate represents the value of threshold voltage when 1.8 V ($V_{wg}$), 4.3 V ($V_{cgov}$) and 1.5 V (V) were applied to the word gate 230, control gate 240, and the drain side, respectively, of the TwinMONOS memory cell 202.

As shown in FIG. 4A, when different resistances were connected to the source side of the TwinMONOS memory cell 202 during reading, the read threshold voltage 430 changed as the resistance value changed. Simultaneously connecting another resistance to the drain side of the Twin-MONOS memory cell 202 did not affect the source side resistance effect. That is, as the resistance value was changed, the read threshold voltage 410 changed almost in the same way as the read threshold voltage 430.

In contrast, when different resistances were connected to only the drain side of the TwinMONOS memory cell 202 during reading, the read threshold voltage 420 did not change as the resistance value increased. This characteristic is desirable, because a program state, indicated by a threshold voltage, should remain unchanged for the read operation.

FIG. 4B illustrates a graphical representation of a difference between the source side resistance effect and the drain side resistance effect on threshold voltage ranges of the memory cell 202 for a read operation. Curve 440 represents the threshold voltage ranges during the read operation while resistances were connected to both sides of the TwinMONOS memory cell 202. Curve 450 represents the threshold voltage ranges during the read operation while different resistances were connected to the drain side of the TwinMONOS memory cell 202. Curve 460 represents the threshold voltage ranges during the read operation while different resistances were connected to the source side of the TwinMONOS memory cell 202. In FIG. 4B, the ordinate represents the value (width) of threshold voltage ranges, calculated as the difference between a maximum threshold voltage and a minimum threshold voltage.

As shown in FIG. 4B, when different resistances were connected to the source side of the TwinMONOS memory cell 202 during reading, the read threshold voltage range 460 changed as the resistance value changed. Connecting a different resistance to the drain side of the TwinMONOS did not affect the source side resistance effect. That is, as the resistance value changed, the read threshold voltage range 440 changed almost in the same way as read threshold voltage range 460.

In contrast, when different resistances were connected to the drain side only of the TwinMONOS memory cell 202 during reading, the read threshold voltage range 450 did not change as the resistance value increased. As explained earlier, this characteristic is desirable, because a program state should remain unchanged for the read operation.

Accordingly, providing the ability to connect different resistances to the drain side of a storage memory cell during programming is a better choice for achieving multi-level cell operation than connecting resistances to the source side. FIGS. 5A, 5B, 6A and 6B further illustrate the effect of having an external variable resistance connected to the drain side of the memory cell 202. FIGS. 5A, 5B, 6A and 6B illustrate graphical plots of actual test data.

Figure 5A:
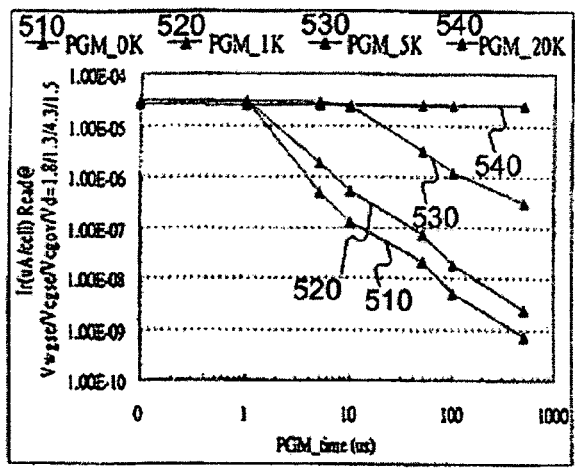
FIG. 5A illustrates a graphical representation of a relationship between read current and program time with an external variable resistance on a drain side of the TwinMONOS memory cell.

FIG. 5A illustrates a graphical representation of a relationship between read current and program time with an external resistance connected on the drain side of the TwinMONOS memory cell 202. Resistance values are applied during both programming and reading of the TwinMONOS memory cell 202. One of ordinary skill in the art will now recognize that, consistent with embodiments of the present invention, read current corresponds to threshold voltage. Curve 510 represents read current at various programming times while a voltage was applied directly to the drain side of the TwinMONOS memory cell 202 without any intervening resistance connected to the drain side of the TwinMONOS memory cell 202. Curve 520 represents read current while a voltage was applied through a resistance of 1K ohms connected to the drain side of the TwinMONOS memory cell 202. Curve 530 represents read current while a voltage was applied through a resistance of 5K ohms connected to the drain side of the TwinMONOS memory cell 202. Curve 540 represents read current while a voltage was applied through a resistance of 20K ohms connected to the drain side of the TwinMONOS memory cell 202. In FIG. 5A, the ordinate represents the value of threshold voltage when 1.8 V ($V_{wgse}$), 1.3 V ($V_{cgse}$), 4.3 V ($V_{cgov}$) and 1.5 V ($V_d$) were applied to the word gate 230, control gate 250, control gate 240, and the drain side, respectively, of the TwinMONOS memory cell 202. The voltages were applied during both programming and reading.

As shown in FIG. 5A, during multi-level programming, read currents were distinct and different when different resistances were connected to the drain side of the TwinMONOS memory cell 202 during programming. This is desirable because good level separation is needed for multi-level cell operation. In this embodiment, after the program time reached a first level (about 1 µs), read current 510 was lower than read current 520, which was lower than read currents 530 and 540. Read current 530 and read current 540 stayed essentially the same until the program time reached a second level (about 10 µs). When the program time exceeded the second level, separation among the various read currents at the different resistance values was clear, as shown in FIG. 5A. In other words, distinct program states may be read or sensed according to distinct current levels or threshold voltage ranges.

Figure 5B:
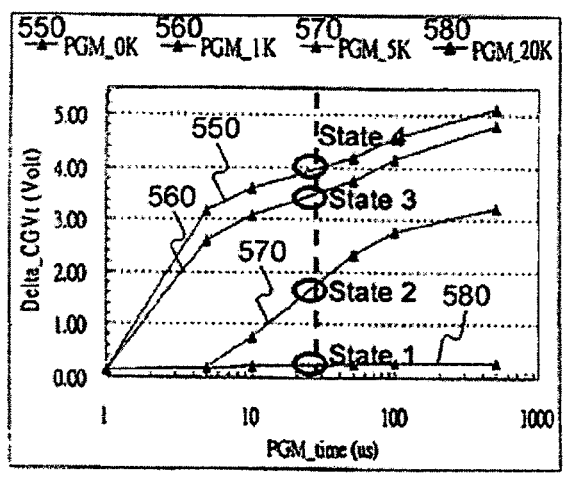
FIG. 5B illustrates a graphical representation of a relationship between program threshold voltage range and program time with an external variable resistance on the drain side of the TwinMONOS memory cell.

FIG. 5B illustrates a graphical representation of a relationship between program threshold voltage range and program time with different external resistances connected to the cell drain side during programming. Curve 550 represents program threshold voltage ranges at various programming times while a voltage was applied directly to the drain side of the TwinMONOS memory cell 202 without any intervening resistance connected to the drain side of the TwinMONOS memory cell 202. Curve 560 represents program threshold voltage ranges while a voltage was applied through a resistance of 1K ohms connected to the drain side of the TwinMONOS memory cell 202. Curve 570 represents program threshold voltage ranges while a voltage was applied through a resistance of 5K ohms connected to the drain side of the TwinMONOS memory cell 202. Curve 580 represents program threshold voltage ranges while a voltage was applied through a resistance of 20K ohms connected to the drain side of the TwinMONOS memory cell 202. The ordinate represents the value (width) of threshold voltage ranges, calculated as the difference between the maximum threshold voltage and the minimum threshold voltage.

As shown in FIG. 5B, during multi-level programming, threshold voltage ranges were distinct and different when different resistances were connected to the drain side of the TwinMONOS memory cell 202 during programming. In this embodiment, after program time reached the first level (about 1 µs), threshold voltage range 550 became larger than threshold voltage range 560, which was larger than threshold voltage ranges 570 and 580. As shown, threshold voltage ranges 570 and 580 stayed essentially the same until the program time reached a second level (about 10 µs). When program time exceeded the second level, separation among various threshold voltage ranges at various resistance values was clear, as shown in FIG. 5B. Therefore, FIGS. 5A and 5B demonstrate that distinct program states may be read according to distinct current levels or threshold voltage ranges.

Figure 6A:
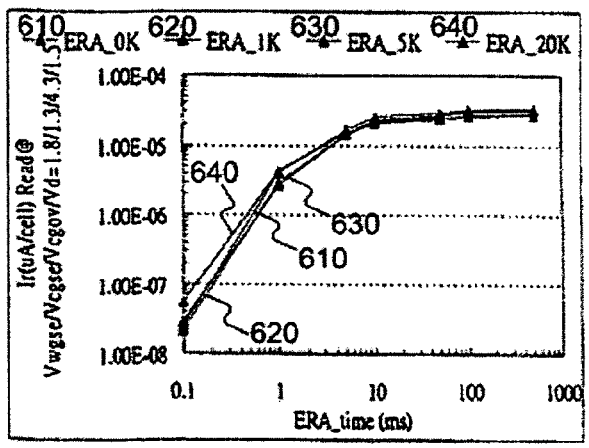
FIG. 6A illustrates a graphical representation of a relationship between read current and erase time with an external variable resistance on the drain side of the TwinMONOS memory cell.

FIG. 6A illustrates a graphical representation of a relationship between read current and erase time with an external resistance connected to the drain side of the TwinMONOS memory cell 202 for an erase operation. One of ordinary skill in the art will recognize that, consistent with the embodiments of the present invention, read current corresponds to threshold voltage. Curve 610 represents read current at various programming times while a voltage was applied directly to the drain side of the TwinMONOS memory cell 202 without any intervening resistance connected to the drain side of the TwinMONOS memory cell 202. Curve 620 represents read current while a voltage was applied through a resistance of 1K ohms connected to the drain side of the TwinMONOS memory cell 202. Curve 630 represents read current while a voltage was applied through a resistance of 5K ohms connected to the drain side of the TwinMONOS memory cell 202. Curve 640 represents read current while a voltage was applied through a resistance of 20K ohms connected to the drain side of the TwinMONOS memory cell 202. In FIG. 6A, the ordinate represents the value of threshold voltage when 1.8 V ($V_{wgse}$), 1.3 V ($V_{cgse}$), 4.3 V ($V_{cgov}$), and 1.5 V ($V_d$) were applied to the word gate 230, control gate 250, control gate 240, and the drain side, respectively, of the TwinMONOS memory cell 202. The voltages were applied during both programming and reading.

As shown in FIG. 6A, read current increased as erase time increased. However, read current increased in the same way regardless of the value of the resistance connected to the drain side of the TwinMONOS memory cell 202. In other words, the value of the resistance had no impact on the erase operation.

Figure 6B:
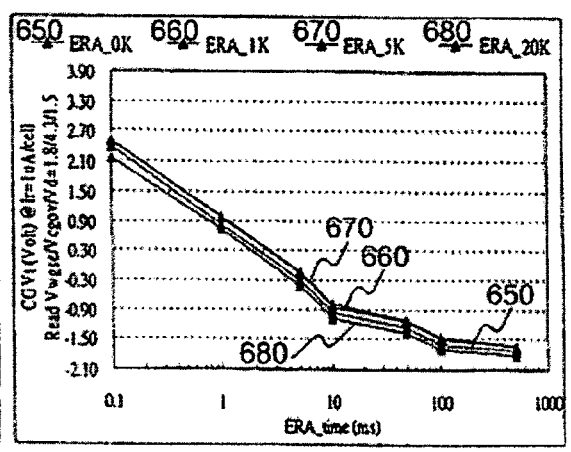
FIG. 6B illustrates a graphical representation of a relationship between program threshold voltage and erase time with an external variable resistance on the drain side of the TwinMONOS memory cell.

FIG. 6B illustrates a graphical representation of a relationship between program threshold voltage and erase time with different external resistances connected to the cell drain side for the erase operation. Curve 650 represents erase threshold voltages at various programming times while a voltage was applied directly to the drain side of the TwinMONOS memory cell 202 without any intervening resistance connected to the drain side of the TwinMONOS memory cell 202. Curve 660 represents erase threshold voltages while a voltage was applied through a resistance of 1K ohms connected to the drain side of the TwinMONOS memory cell 202. Curve 670 represents erase threshold voltages while a voltage was applied through a resistance of 5K ohms connected to the drain side of the TwinMONOS memory cell 202. Curve 680 represents erase threshold voltages while a voltage was applied through a resistance of 20K ohms connected to the drain side of the TwinMONOS memory cell 202. In FIG. 6B, the ordinate represents the value of threshold voltage when 1.8 V ($V_{wgse}$), 4.3 V ($V_{cgov}$), and 1.5 V ($V_d$) were applied to the word gate 230, control gate 240, and the drain side, respectively, of the TwinMONOS memory cell 202.

As shown in FIG. 6B, threshold voltage decreased as erase time increased. However, threshold voltage decreased in the same way regardless of the value of the resistance connected to the drain side of the TwinMONOS memory cell 202. In other words, the value of the resistance had no impact on the erase operation.

Although specific resistance values such as 0, 1K, 5K, and 20K ohms were used in various embodiments above, one of ordinary skill in the art will now recognize that other resistance values may be used within the spirit and scope of the present invention.

Figure 7:
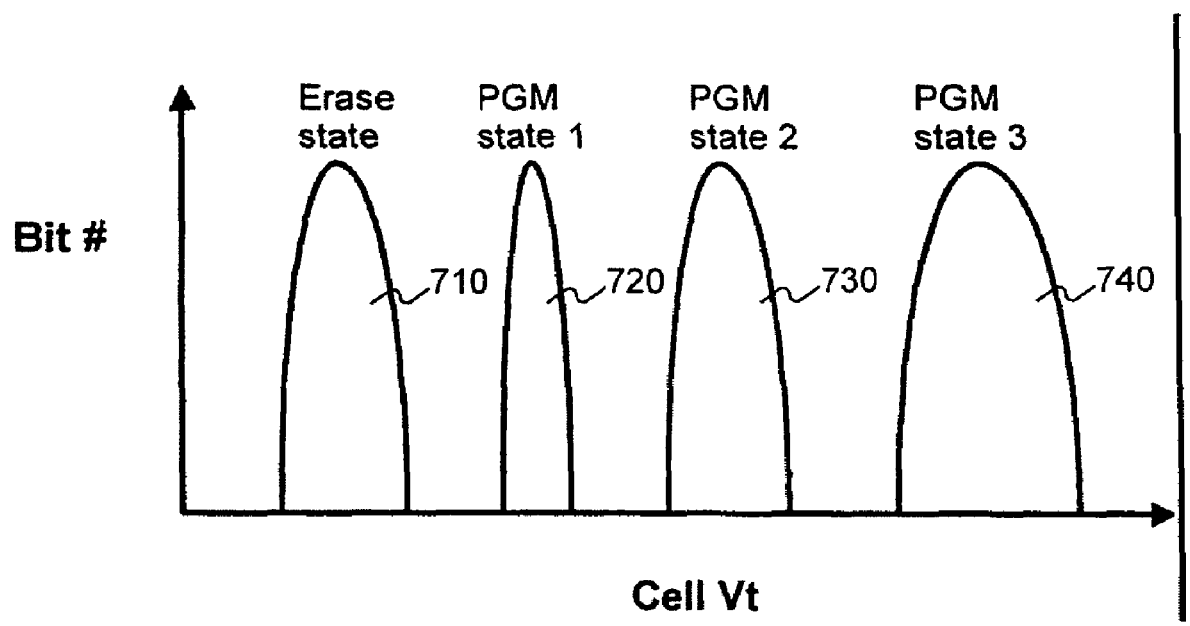
FIG. 7 is an exemplary schematic view illustrating program threshold voltage distribution for multi-level operation.

FIG. 7 illustrates a graphical representation of a program threshold voltage distribution for multi-level threshold voltage operation of memory cell 202. A threshold voltage range 710 represents the erase state, while threshold voltage ranges 720, 730, and 740 represent program states 1, 2, and 3, respectively. Among the program states, program state 1 has the narrowest threshold voltage range at a relatively low voltage level, while program state 3 has the largest threshold voltage range at a relatively high voltage level. As shown, separation between the program states is sufficient for accurate multi-level program and read operations.

Figure 8:
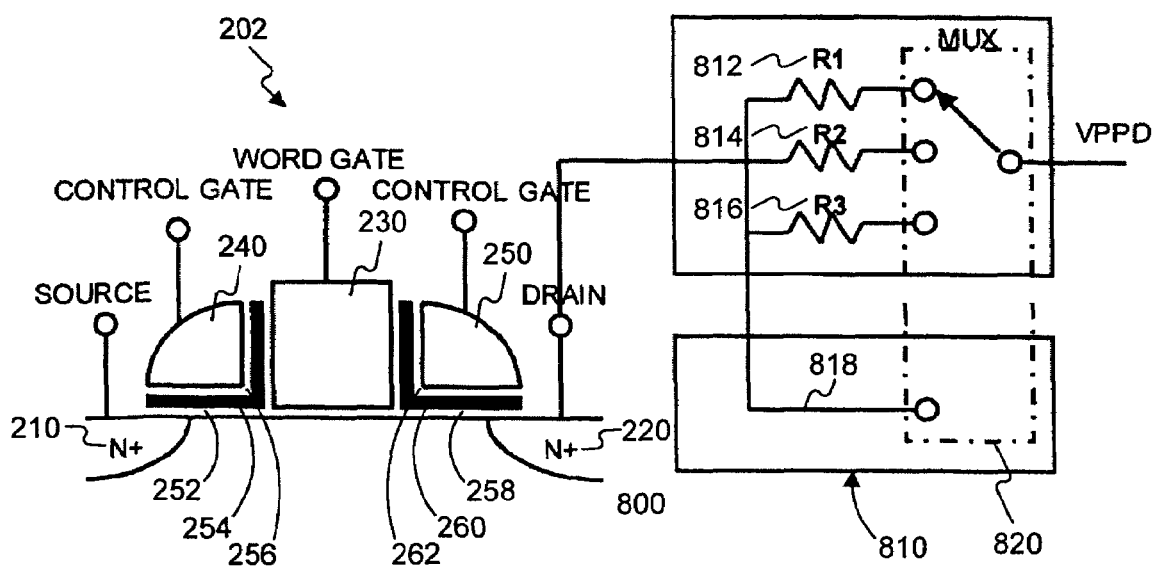
FIG. 8 is a schematic diagram illustrating an exemplary structure for performing a read operation.

FIG. 8 is a schematic diagram illustrating an exemplary structure 800 during read. As shown in the diagram, a read operation by direct connection 818 is used for gaining large read current. A variable resistance 810 is coupled to the drain side of the TwinMONOS memory cell 202. The variable resistance 810 is capable of providing a plurality of different resistance values. A programming voltage VPPD or a read voltage may be applied to the drain side through the variable resistance 810. In one embodiment, the variable resistance 810 comprises a resistor circuit. The resistor circuit includes a plurality of resistors 812, 814, and 816, a direct connection 818 having no resistance, and a multiplexer 820. Resistors 812, 814, and 816 may have different resistance values and are connected in parallel with each other and the direct connection 818. The multiplexer 820 has an input for receiving the programming voltage VPPD or the read voltage and a plurality of outputs respectively coupled to first ends of the plurality of resistors 812, 814, and 816 and the direct connection 818. Thus, the variable resistance 810 differs from the variable resistance 270 by additionally providing the direct connection 818.

During read, if the multiplexer 820 is connected to any of resistors 812, 814, and 816, read circuit operation is simple but read current is low. However, if the multiplexer 820 is connected to the direct connection 818, read circuit operation is complex but read current is high.

One of ordinary skill in the art will now recognize that, consistent with embodiments of the present invention, nitride storage memory cells of many types and natures such as NROM and SONOS are contemplated.

As discussed earlier, programming of MONOS and NROM type cells can be performed by CHE injection. One of ordinary skill in the art will now recognize that, consistent with embodiments of the present invention, various structures and methods are contemplated for programming and reading operations. Similarly, consistent with the embodiments of present invention, various structures and methods are contemplated for erase operations. For example, Band-To-Band Tunneling Hot-Hole Injection (BTBHHI) may be used for erase.

While the present invention has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for programming a multi-level nitride storage memory cell including a nitride storage region that stores different programming states corresponding to a plurality of threshold voltage levels, comprising:

selecting a resistor from a variable resistance circuit including a plurality of exclusively selectable resistors having different resistance values and a direct connection to provide a zero magnitude resistance, each resistor having a predetermined magnitude and corresponding directly to one of the plurality of threshold voltage levels, and at least one of the resistors having a value in the range of 1 k ohm to 20 k ohm;

connecting a drain side of the nitride storage memory cell to the selected resistor; and programming the nitride storage memory cell to store one of the program states corresponding to the one of the threshold voltage levels by applying a programming voltage to the drain side through the selected resistor.

2. The method of claim 1, further including providing the nitride storage memory cell as one of a NROM, a SONOS, and a TwinMONOS.

3. The method of claim 1, wherein selecting a resistor from the variable resistance circuit includes:

providing a plurality of resistors having a plurality of resistance values and connected in parallel; and providing a multiplexer having an input for receiving the programming voltage and a plurality of outputs respectively coupled to first ends of the plurality of resistors;

wherein the connecting further includes controlling the multiplexer to connect the selected resistor.

4. A multi-level flash memory device, comprising:

a nitride storage memory cell including a nitride storage region that stores different programming states corresponding to a plurality of threshold voltage levels; and a variable resistance circuit including a plurality of exclusively selectable resistors having different resistance values and a direct connection to provide a zero magnitude resistance, each resistor having a predetermined magnitude and corresponding directly to one of the plurality of threshold voltage levels, and at least one of the resistors having a value in the range of 1 k ohm to 20 k ohm;

wherein a drain side of the nitride storage memory cell is connected to a selected resistor of the plurality of exclusively selectable resistors, the variable resistance circuit coupling a programming voltage to the drain side of the nitride storage memory cell.

5. The multi-level flash memory device of claim 4, wherein the nitride storage memory cell comprises one of a NROM, a SONOS, and a TwinMONOS.

6. The multi-level flash memory device of claim 4, wherein the variable resistance circuit includes:

a plurality of resistors having a plurality of resistance values and connected in parallel; and a multiplexer having an input for receiving the programming voltage and a plurality of outputs respectively coupled to first ends of the plurality of resistors;

wherein the multiplexer is controllable to connect the selected resistor.

* * * * *